(12) United States Patent
Nakayama et al.

(10) Patent No.: US 7,045,953 B2
(45) Date of Patent: May 16, 2006

(54) ORGANIC ELECTROLUMINESCENCE DEVICE WITH CARRIER TRANSPORT MULTILAYERED BODY AND ORGANIC ELECTROLUMINESCENCE DISPLAY

(75) Inventors: Masaya Nakayama, Kawasaki (JP); Yuichiro Itai, Kawasaki (JP); Masaru Kinoshita, Kawasaki (JP); Jun Kodama, Kawasaki (JP)

(73) Assignee: Fuji Photo Film Co., Ltd., Tokyo (JP)

( * ) Notice: Subject to any disclaimer, the term of this patent is extended or adjusted under 35 U.S.C. 154(b) by 0 days.

(21) Appl. No.: 11/063,573

(22) Filed: Feb. 24, 2005

(65) Prior Publication Data

US 2005/0179370 A1  Aug. 18, 2005

Related U.S. Application Data

(63) Continuation of application No. PCT/JP03/03027, filed on Mar. 13, 2003.

(51) Int. Cl.
 *H01J 1/62* (2006.01)
 *H01J 63/04* (2006.01)

(52) U.S. Cl. .................. 313/504; 313/506

(58) Field of Classification Search ........... 313/504, 313/506, 512
See application file for complete search history.

(56) References Cited

U.S. PATENT DOCUMENTS

| | | | | |
|---|---|---|---|---|
| 5,343,050 A | * | 8/1994 | Egusa et al. | 257/40 |
| 5,709,959 A | * | 1/1998 | Adachi et al. | 428/690 |
| 5,739,545 A | * | 4/1998 | Guha et al. | 257/40 |
| 6,121,727 A | * | 9/2000 | Kanai et al. | 313/504 |
| 6,551,725 B1 | * | 4/2003 | Raychaudhuri et al. | 428/690 |
| 6,558,820 B1 | * | 5/2003 | Raychaudhuri et al. | 428/690 |

FOREIGN PATENT DOCUMENTS

| | | |
|---|---|---|
| JP | 6-36877 | 2/1994 |
| JP | 7-188649 | 7/1995 |
| JP | 2000-82585 | 3/2000 |

* cited by examiner

*Primary Examiner*—Kevin Quarterman
(74) *Attorney, Agent, or Firm*—Westerman, Hattori, Daniels & Adrian, LLP

(57) ABSTRACT

An organic EL device includes a transparent substrate (31), an anode (32), a hole injection layer (33), a hole transport layer (34), an luminescent layer (35), an electron transport multilayered body (36), a cathode-side electron transport layer (37), and a cathode (38) formed on the substrate (31) in that order. The electron transport multilayered body (36) includes alternate layered two kinds of electron transport layers (36A, 36B) having electron affinities that are different from each other. Increasing the amount of electron current injected from the cathode (38) for balancing with the amount of hole current, and enhancing luminous efficiency.

10 Claims, 11 Drawing Sheets

FIG.8

| LAYER MATERIAL | ELECTRON AFFINITY Ea(eV) | ENERGY GAP Eg(eV) | IONIZATION POTENTIAL Ip(eV) |
|---|---|---|---|
| TYG-201 LAYER | 3.20 | 2.40 | 5.60 |
| TYE-704 LAYER | 2.97 | 2.76 | 5.73 |
| Alq3 LAYER | 3.07 | 2.71 | 5.78 |
| α-NPD LAYER | 2.42 | 3.04 | 5.46 |
| 2-TNATA LAYER | 2.19 | 3.00 | 5.19 |

FIG.9

| | FIRST EXAMPLE | SECOND EXAMPLE | THIRD EXAMPLE | FIRST COMPARATIVE EXAMPLE | SECOND COMPARATIVE EXAMPLE |
|---|---|---|---|---|---|
| CATHODE | LiF/Al | LiF/Al | LiF/Al | LiF/Al | LiF/Al |
| ELECTRON TRANSPORT LAYER | | TYE704(20nm) | TYE704(20nm) | TYE704(50nm) | TYE704(20nm) |
| ELECTRON TRANSPORT MULTILAYER BODY | TYG201(15nm) TYE704(15nm) } NUMBER OF REPETITION 2 | TYG201(10nm) TYE704(10nm) } NUMBER OF REPETITION 3 | TYG201(7.5nm) TYE704(7.5nm) } NUMBER OF REPETITION 4 | NOTHING | TYG201(30nm) TYE704(30nm) } NUMBER OF REPETITION 1 |
| LUMINESCENT LAYER | TYG201(20nm) | TYG201(20nm) | TYG201(20nm) | TYG201(50nm) | TYG201(20nm) |
| HOLE TRANSPORT LAYER | α-NPD(10nm) | α-NPD(10nm) | α-NPD(10nm) | α-NPD(10nm) | α-NPD(10nm) |
| HOLE INJECTION LAYER | 2-TANA(40nm) | 2-TANA(40nm) | 2-TANA(40nm) | 2-TANA(40nm) | 2-TANA(40nm) |
| ANODE | ITO | ITO | ITO | ITO | ITO |
| LUMINESCENCE THRESHOLD (V) | 3 | 3 | 3 | 4 | 4 |
| CURRENT DENSITY (mA/cm$^2$) | 10.86 | 11.09 | 11.44 | 11.73 | 10.03 |
| LUMINANCE (cd/m$^2$) | 913 | 1075 | 1017 | 967 | 750 |
| LUMINOUS EFFICIENCY (cd/A) | 8.40 | 9.70 | 8.89 | 8.25 | 7.48 |

FIG.10

| | FOURTH EXAMPLE | FIFTH EXAMPLE | THIRD COMPARATIVE EXAMPLE | FOURTH COMPARATIVE EXAMPLE |
|---|---|---|---|---|
| CATHODE | LiF/Al | LiF/Al | LiF/Al | LiF/Al |
| ELECTRON TRANSPORT LAYER | TYE704(20nm) | TYE704(20nm) | TYE704(50nm) | TYE704(20nm) |
| ELECTRON TRANSPORT MULTILAYER BODY | Alq3(10nm) / TYE704(10nm) } NUMBER OF REPETITION 3 | Alq3(7.5nm) / TYE704(7.5nm) } NUMBER OF REPETITION 4 | Alq3(30nm) | Alq3(30nm) / TYE704(30nm) } NUMBER OF REPETITION 1 |
| LUMINESCENT LAYER | TYG201(20nm) | TYG201(20nm) | TYG201(20nm) | TYG201(20nm) |
| HOLE TRANSPORT LAYER | α-NPD(10nm) | α-NPD(10nm) | α-NPD(10nm) | α-NPD(10nm) |
| HOLE INJECTION LAYER | 2-TANA(40nm) | 2-TANA(40nm) | 2-TANA(40nm) | 2-TANA(40nm) |
| ANODE | ITO | ITO | ITO | ITO |
| LUMINESCENCE THRESHOLD (V) | 5 | 5 | 5 | 5 |
| CURRENT DENSITY (mA/cm$^2$) | 13.22 | 13.72 | 15.84 | 14.48 |
| LUMINANCE (cd/m$^2$) | 994 | 1021 | 1058 | 1005 |
| LUMINOUS EFFICIENCY (cd/A) | 7.52 | 7.44 | 6.68 | 6.75 |

ORGANIC ELECTROLUMINESCENCE DEVICE WITH CARRIER TRANSPORT MULTILAYERED BODY AND ORGANIC ELECTROLUMINESCENCE DISPLAY

CROSS-REFERENCE TO RELATED APPLICATIONS

This application is a U.S. continuation application filed under 35 USC 111(a) claiming benefit under 35 USC 120 and 365(c) of PCT application JP 2003/003027, filed Mar. 13,2003. The foregoing application is hereby incorporated herein by reference.

BACKGROUND OF THE INVENTION

1. Field of the Invention

The present invention generally relates to an electroluminescence device and a flat panel display using an electroluminescence device, and more particularly to an organic electroluminescence device and an organic electroluminescence display.

2. Description of the Related Art

In recent years, demands of the market are shifting from a conventional large size and heavy-weight CRT (Braun tube) display to a thin-size and light-weight flat display. As for the flat displays, there are liquid crystal displays and plasma displays which are employed, for example, as home television receivers and monitors of personal computers.

Currently, an electroluminescence display (hereinafter referred to as "EL display") and more particularly, an organic electroluminescence display is drawing attention as the next generation flat display. Ever since the report on a multilayered type element being layered with organic thin films having a hole transport property and an electron transport property (C. W.Tang and S. A. Van Slyke, Applied Physics Letters vol. 51, 913 (1987), organic EL devices included in the organic EL display are gathering attention as a large area light emitting element that illuminates with a low voltage of 10 V or less, and are being researched extensively. Compared to the liquid crystal display, the organic EL display requires no backlight since the organic EL display is self-luminous, thereby yielding a thinner, simple-structured, and flexible display. Therefore, the organic EL display is expected to be widely applied in various fields. In employing the organic EL display for practical use, however, a task of obtaining a longer life-span for the organic EL display is yet to be achieved.

FIG. 1 is a cross-sectional drawing showing a conventional organic EL device. As shown in FIG. 1, an organic EL device 10 has a transparent anode 12, a hole injection layer 13, a hole transport layer 14, a luminescent layer 15, an electron transport layer 16, and a cathode 18 which are formed in this order on a transparent insulating substrate 11. In the organic EL device 10, holes are injected from the transparent anode 12 to the hole injection layer 13, while electrons are injected from the cathode 18. The holes and electrons are recombined in the luminescent layer 15, to thereby release energy. This energy excites, for example, an organic fluorescent part in the luminescent layer 15, thereby causing illumination. Luminance is determined by the amount of recombination of the recombining holes and electrons with respect to time. Since luminous efficiency is expressed by luminance with respect to current consumption, the luminous efficiency becomes higher when the amount of electrons and holes contributing to illumination is more balanced.

In the organic EL device 10, the transparent anode 12 is formed of ITO (Indium Tin Oxide). By oxidizing the surface of the ITO with, for example, UV ozone or oxygen plasma, the work function can be consistent with the ionization potential of the hole injection layer. This reduces the hole injection barrier between the transparent anode 12 to the hole injection layer 13 and increases the amount of hole current.

Meanwhile, metals, such as Li, Mg, or alloys such as Al—Li, Mg—Ag, which have a low electron injection barrier work function with respect to the electron transport layer 16, are used in the cathode 18. In recent years, it is found that use of a metal fluoride (e.g. LiF/Al) for the electron injection layer, even in a case of employing a simple Al as the cathode 18, yields an electron injection performance that is equal to a device using low work function simple metals, such as Li, Mg or alloys thereof, and that device properties, such as luminous efficiency, are the same as or greater than using metals with low work function (L. S. Hung, C. W. Tang Tang, and M. G. Mason, Applied Physics Letters vol. 70 (2), 152 (1997).

Nevertheless, when a low work function simple metal, alloys or LiF, for example, is used in the cathode 18, the amount of electron current reaching the luminescent layer 15 becomes less than the amount of hole current, thereby causing unevenness in the amount of current between the electrons and the holes. This causes the current of the holes not contributing to illumination to become wasted and prevents a sufficient luminous efficiency from being obtained.

Furthermore, in a case where luminous efficiency is low, the amount of voltage is to be increased for obtaining a sufficient luminance and supplying a greater amount of current. However, an excess application of voltage is liable to cause a chemical reaction at interfaces between the anode 12 and the hole injection layer 13 and between the cathode 18 and the electron transport layer 16. This leads to property change and function deterioration in the hole injection layer 13 and the electron transport layer 16, and furthermore, device failure. Therefore, there is a problem in obtaining a sufficient life-span for the device.

Furthermore, Japanese Laid-Open Patent Application No. 2002-43063 discloses a multilayer electron transport area provided for improving carrier injection to a luminescent layer and reducing operating voltage. However, this document does not disclose a specific configuration of the structure of the multilayer electron transport area.

SUMMARY OF THE INVENTION

Accordingly, it is an object of the present invention to provide a novel and useful organic electroluminescence device and an organic electroluminescence display that obviate the above-described problems.

A more specific object of the present invention is to provide an organic electroluminescence device that has excellent luminous efficiency and that is able attain a long life-span.

According to one aspect of the present invention, an organic electroluminescence device includes an anode, a luminescent layer formed on the anode, a carrier transport multilayered body formed on the luminescent layer, and a cathode formed on the carrier transport multilayered body, wherein the carrier transport multilayered body is alternately layered by a first carrier transport layer and a second carrier transport layer, wherein the first carrier transport layer and the second carrier transport layer have electron transportabilities that are different from each other.

Here, electron transportability is defined by, for example, the electron affinity, the ionization potential, or the energy gap of the organic material included in the first carrier transport layer and the second carrier transport layer.

With the present invention, the amount of electron current injected into the luminescent layer can be increased by providing the carrier transport multilayered body having alternate layers of the first carrier transport layer and the second carrier transport layer having different electron affinities between the luminescent layer and the cathode. As a result, the organic electroluminescence device of the present invention attains a high luminous efficiency and a long life-span by balancing the amount of electron current and the amount of hole current.

The first carrier transport layer and the second carrier transport layer have different electron affinities. Owing to the different electron affinities of the first carrier transport layer and the second carrier transport layer, multiple quantum wells can be formed and the amount of electron current can be increased. It is to be noted that electron affinity is expressed as an energy difference between an energy of a lower end of a conductive member of a material included in, for example, the carrier transport layer and a vacuum level, and is indicated as a positive value.

According to another aspect of the present invention, an organic electroluminescence display including any one of the aforementioned organic electroluminescence devices is provided.

With the present invention, an organic electroluminescence display having high luminous efficiency and a long life-span can be obtained.

BRIEF DESCRIPTION OF THE DRAWINGS

FIG. 8 is a diagram showing a characteristic value of an electron transport layer and a hole transport layer used in organic EL devices for examples and comparative examples;

FIG. 9 is a diagram showing layer configuration and evaluation results of organic EL devices of first-third examples and first-second comparative examples;

FIG. 10 is a diagram showing layer configuration and evaluation results of organic EL devices of fourth-fifth examples and third-fourth comparative examples.

DESCRIPTION OF THE PREFERRED EMBODIMENTS

First, the process in reaching the present invention is described below. The inventors of the present invention conducted the below-given experiments and found that injectable current density can be increased by providing a luminescent layer and a cathode having therebetween an electron transport multilayered body with alternately layered electron transport layers having different electron transportabilities.

Figure 1:
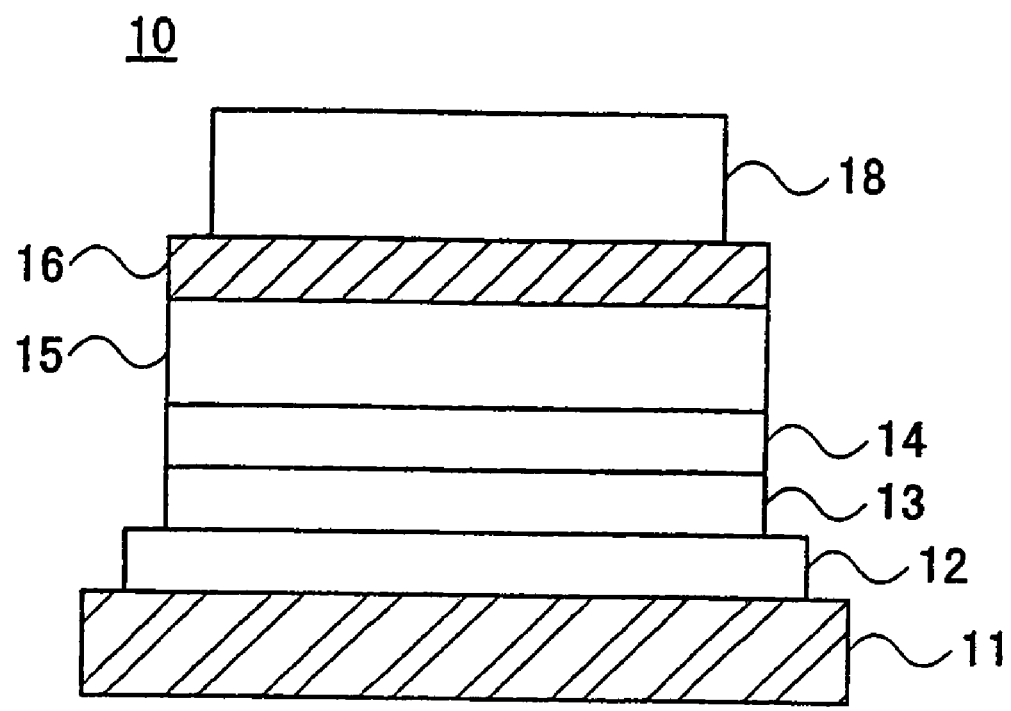
FIG. 1 is a cross-sectional view showing a conventional organic EL device.
Figure 2:
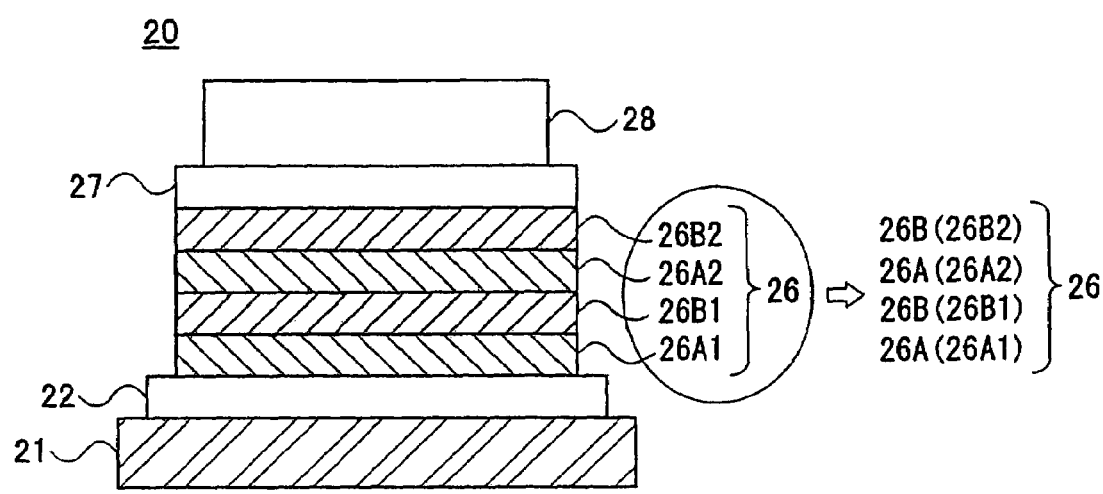
FIG. 2 is a cross-sectional view showing a configuration of a device body of the present invention.

FIG. 2 is a cross-sectional drawing showing a configuration of a device body of the present invention which was used in the experiments. With reference to FIG. 2, a device body 20 includes a substrate 21, an anode 22 formed on the substrate 21, an electron transport multilayered body 26 with two different electron transport layers 26A, 26B that are alternately layered on the anode 22, a cathode-side electron transport layer 27 layered on the electron transport multilayered body 26, and a cathode 28 formed on the cathode-side electron transport layer 27. Al is used for the anode 22, and LiF/Al is used for the cathode 28. Furthermore, TYE 704 (Name of product manufactured by Toyo Ink Mfg. Co. Ltd.) is used for the cathode-side electron transport layer 27. The electron transport multilayered body 26 includes a first electron transport layer 26A1 and a second electron transport layer 26B1 (starting from the anode side), and further continuing in this order, a first electron transport layer 26A2 and a second electron transport layer 26B2 being layered alternately. Here, TYE 704 is used for the first electron transport layer 26A, and TYG 201 (Name of product manufactured by Toyo Ink Mfg. Co. Ltd.) is used for the second electron transport layer 26B. Although TYG 201 (Name of product manufactured by Toyo Ink Mfg. Co. Ltd.) is known as a green color luminescent material, it can also be used for an electron transport layer. Device bodies for which the layering is repeated N=1, 3, 4 times and a device body for comparison having a similar configuration but without an electron transport multilayered body, that is, a device body to which the layering is repeated N=0 times, are fabricated. The thicknesses of the electron transport multilayered body 26 (as indicated inside brackets {}) and the cathode-side electron transport layer 27 are shown below. It is to be noted that the cathode-side electron transport layer 27 is provided to each of the device bodies so that the condition(s) of the electron injection barrier from the cathode may be uniform.

N=0: TYG 201 (80 nm)
N=1: {[TYG 201 (30 nm)/TYE 704 (30 nm) ]$_1$}/TYG 201 (20 nm)
N=3: {[TYG 201 (10 nm)/TYE 704 (10 nm) ]$_3$}/TYG 201 (20 nm)
N=4: {[TYG 201 (7.5 nm)/TYE 704 (7.5 nm)]$_4$}/TYG 201 (20 nm)

In order to measure the amount of current flowing in the electron transport multilayered body 26, a direct current of 0–10 V in intervals of 0.5 V is applied between the anode 22 and the cathode 28, and the amount of current flowing in the device is measured with an ampere meter.

Figure 3:
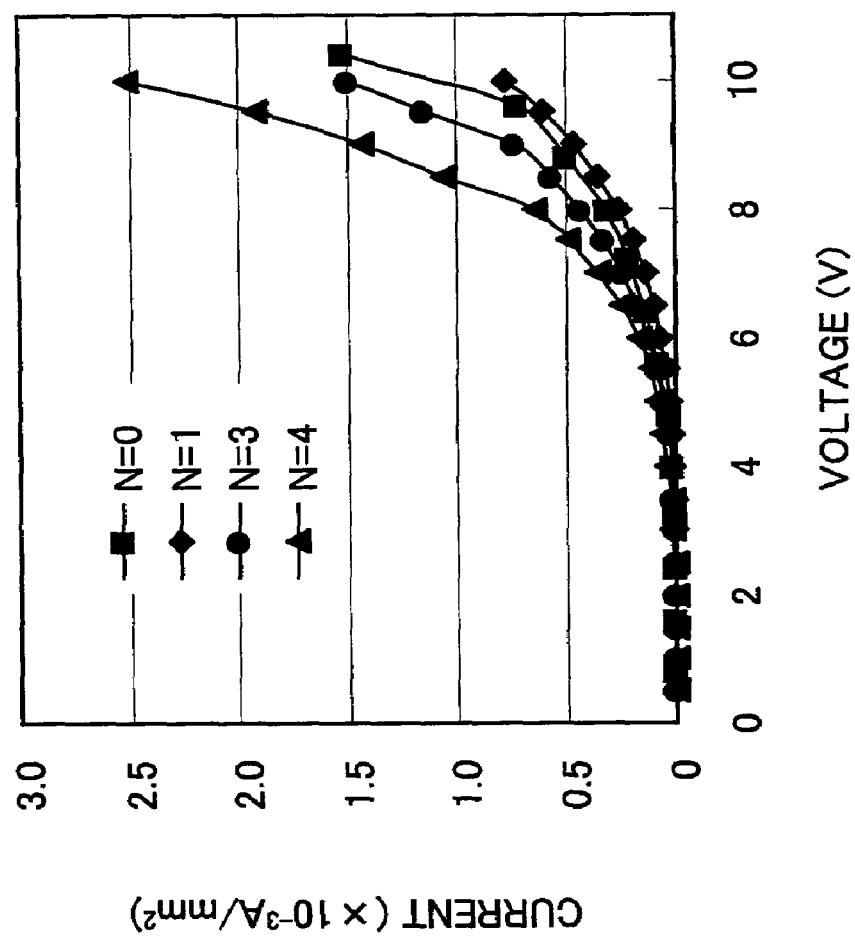
FIG. 3 is a characteristic diagram I-V of the configuration of the device body shown in FIG. 2.

FIG. 3 is a drawing showing properties I-V of the device body shown in FIG. 2. In comparing between N=0 and N=1 with reference to FIG. 3, the amount of current is relatively the same, or N=1 is slightly smaller. Meanwhile, in N=3 and N=4, it is apparent that the amount of current increases considerably and thus increases as the number of repetitions becomes larger. Accordingly, the amount of electron current can be increased by repeating the layering of the two electron transport layers 26A and 26B that have electron transportabilities that are different from each other. By increasing the number of the multilayers, a sufficient amount of electron current can be provided to obtain balance with the amount of hole current. It is assumed that this owes to multiple quantum wells being formed by alternately layering electron transport layers having different electron affinities, in which the effect of the multiple quantum wells increases the amount of electron current. It is to be noted that the reason the amount of current does not increase in a case of N=1 is because it is assumed that no multiple quantum well is formed in a case of N=1.

Accordingly, the inventors have arrived at the present invention of an organic EL device having an electron transport multilayered body with layers of different electron transport layers.

FIRST EMBODIMENT

Embodiments of the present invention of an organic EL device are described with reference to the accompanying drawings.

Figure 4:
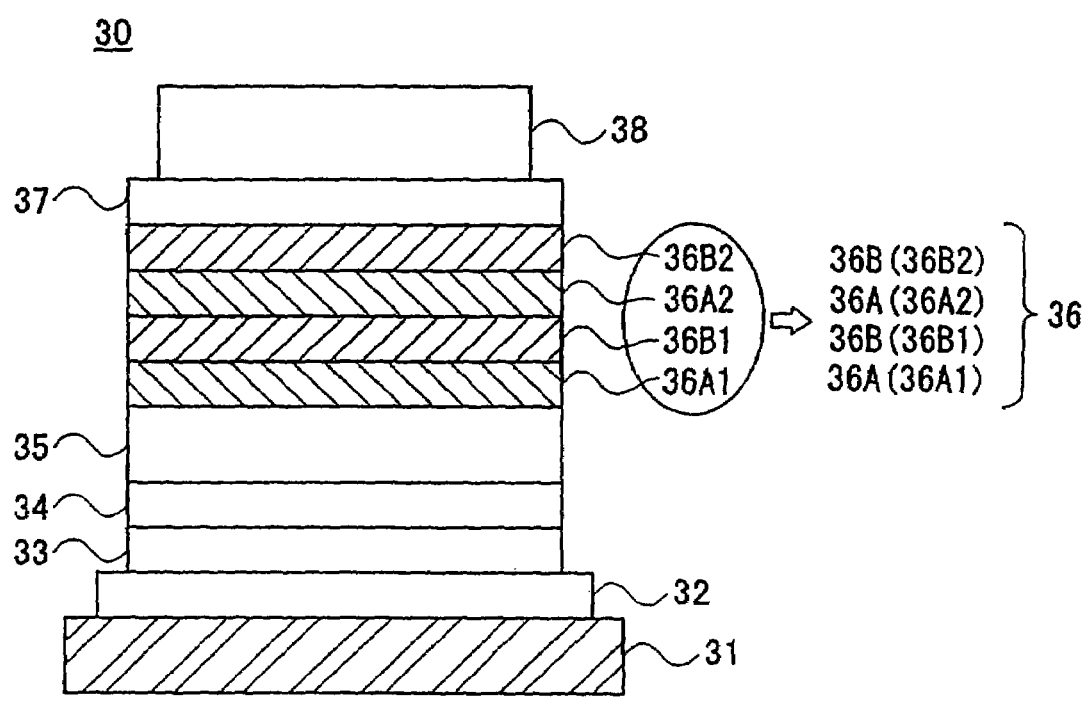
FIG. 4 is a cross-sectional view showing an organic EL device according to a first embodiment of the present invention.
Figure 5:
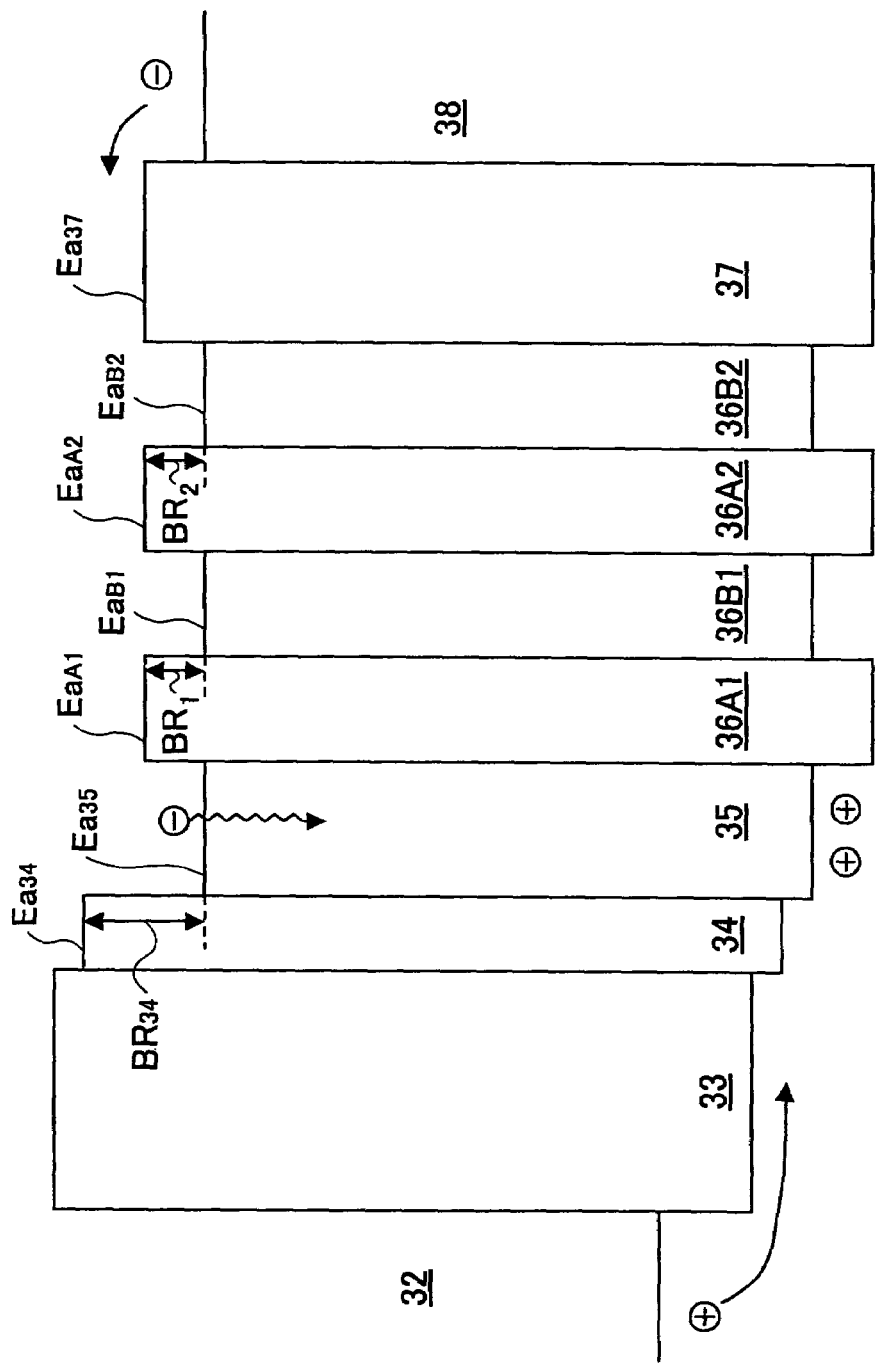
FIG. 5 is an energy diagram of an organic EL device according to the first embodiment.

FIG. 4 is a cross-sectional view showing an organic EL device according to an embodiment of the present invention. FIG. 5 is an example of an energy diagram of an organic EL device according to the embodiment shown in FIG. 4. In FIG. 5, "Ea" indicates electron affinity, "Eg" indicates energy gap, and "Ip" indicates ionization potential. With reference to FIGS. 4 and 5, according to this embodiment, an organic EL device 30 has a transparent substrate 31, an anode 32, a hole injection layer 33, a hole transport layer 34, a luminescent layer 35, an electron transport multilayered body 36, a cathode-side electron transport layer 37, and a cathode 38 which are formed in that order on the substrate 31.

For example, a transparent insulating substrate such as glass or quartz, a semiconductor substrate such as Si, a film such as PET or PEN, or a resin substrate such as PVA may be used for the substrate 31. Furthermore, TFTs (Thin Film Transistor) may be disposed in a matrix-like manner for controlling on/off of the organic EL device on the aforementioned substrates. Although the thickness of the substrate 31 may suitably selected depending on the material of the substrate, the thickness of the substrate 31 is approximately 200 μm–1000 μm.

The anode 32 is formed on the substrate 31 by using a conductive material such as Al and performing a vapor deposition method or a sputtering method therewith. From the aspect of hole injection property, it is preferable to use, for example, Au, Cr, or Mo, which has a large work function. However, in a case where light is emitted from the anode side, it is formed with a transparent material such as ITO or indium oxide.

The hole injection layer 33 and the hole transport layer 34 have high HOMO, that is, materials with low ionization potential are employed thereto. As a representative example, there is copper phthalocyanine (CuPc), m-MTDATA of starburst type amine, 2-TNATA, TPD, or α-NPD. It is to be noted that a hole injection layer may be provided for performing more hole injections between the anode and the hole transport layer. The aforementioned copper phthalocyanine (CuPc), m-MTDATA of starburst type amine, or 2-TNATA may be used as the hole injection layer.

Furthermore, it is preferable for the hole transport layer 34 to have a small electron affinity with respect to the luminescent layer 35. Thereby, electrons can accumulate in the luminescent layer and space density of electrons in the luminescent layer can be increased. More specifically, as shown in FIG. 5, an energy barrier having a height $BR_{34}$ ($=Ea_{35}-Ea_{34}$) is formed, wherein a relation between electron affinity $Ea_{34}$ of the hole transport layer 34 and electron affinity $Ea_{35}$ of the luminescent layer is represented as $Ea_{34}<Ea_{35}$.

It is to be noted that hole transport layers having different ionization potentials may be provided in an alternately layered manner. By forming the energy barrier against the holes, the amount of hole current can be controlled, thereby achieving balance with the amount of electron current.

A metal complex material, for example, Alq 3 (tris (8-hydroxyquinolio aluminum), Znq 2, or Balq 2, or a pigment material, for example, PZ10 or EM2 may be used for the luminescent layer 35. Furthermore, a material having a pigment such as rubrene or TPB, doped with a host material such as Alq3, may also be used.

The cathode-side electron transport layer 37 includes the same material(s) included in the below-described electron transport multilayered body 36. More particularly, it is preferable for the cathode-side electron transport layer 37 to have an energy gap that is same as or greater than the electron transport layer included in the electron transport multilayered body 36. Thereby, the cathode-side electron transport layer 37 can be prevented from illuminating.

A metal (e.g. Li) or a metal alloy (e.g. Mg—Ag, Al—Li) having a small work function is used for the cathode 38. A cathode having an electron injection layer of, for example, metal fluoride (e.g. LiF/Al) may also be used.

The electron transport multilayered body 36 has alternately layered layers including a first electron transport layer 36A and a second electron transport layer 36B having different electron transportabilities. Here, different electron transportabilities signify, for example, a difference in HOMO, LUMO (Lowest Unoccupied Molecular Orbital), or conductivity. In this embodiment, the first electron transport layer 36A and the second electron transport layer 36B are described as layers having different electron affinities with respect to each other.

A metal chelate of 8-hydroxyquinoline, a metal thioxynoid compound, an oxadiazole metal chelate, triazine, 4,4'-bis (2,2-diphenylvinyl) biphenyl, for example, may be used for the first electron transport layer 36A or the second electron transport layer 36B. A preferable material among the metal chelates of 8-hydroxyquinoline may be, for example, Alq 3 (tris (8-hydroxyquinolinate) aluminum, Balq (bis (8-hydroxyquinolato)-(4-phenylphenolato) aluminum, or bis PBD. Furthermore, a preferable material among the metal thioxynoid compounds may be, for example, bis (8-quinolinthiolato) zinc, bis (8-quinolinthilato) cadmium, tris (8-quinolinthiolato) gallium, or tris (8-quinolinthiolato) indium. Furthermore, a preferable material among the oxadiazole metal chelates may be, for example, bis [2-(2-hydroxyphenyl)-5-phenyl-1,3,4-oxadiazolato] zinc, bis [2-(2-hydroxyphenyl)-5-phenyl-1,3,4-oxadiazolato]beryllium, bis [2-(2-hydroxyphenyl)-5-(1-naphthyl)-1,3,4-oxadiazolato] zinc, or bis [2-(2-hydroxyphenyl)-5-(1-naphthyl)-1,3,4-oxadiazolato] beryllium.

The aforementioned materials for the electron transport layers are chosen as the first electron transport layer 36A and the second electron transport layer 36B so that the relation of electron affinities satisfies $Ea_A<Ea_B$ in a case where $Ea_A$ indicates the electron affinity of the first electron transport layer 36A and $Ea_B$ indicates the electron affinity of the second electron transport layer 36B. In choosing a material that satisfies this relation, a below-described measuring method may be employed to obtain electron affinity.

Although electrons flow from the cathode 38 toward the luminescent layer 35, in the interface between the second electron transport layer 36B2 and the first electron transport layer 36A2, for example, of the electron transport multilayered body 36, a difference $Ea_{B2}-Ea_{A2}$ in electron affinity between the two layers causes an energy barrier $BR_2$ to be formed and a quantum-well potential to be generated. Likewise, between the second transport layer 36B1 and the first electron transport layer 36A1, an energy barrier $BR_1$ is formed and a quantum-well potential is generated. It is, therefore, assumed that multiple quantum wells are formed and the amount of electron current is increased.

The film thicknesses of the first electron transport layer 36A and the second electron transport layer 36B can be suitably selected in accordance with the number of repetitions of the layering of the first electron transport layer 36A and the second electron transport layer 36B; they are, however, set in a range of 2 nm–50 nm (preferably 5 nm–20 nm). If the thickness is greater than 50 nm, the thickness of the entire organic EL device would be too thick. Thereby, application voltage would too large, an electro-chemical reaction would more easily occur at the anode, cathode, or at its interface with respect to a contacting hole injection layer or a cathode-side electron transport layer, and the life-span of the organic EL element would be adversely affected. Furthermore, if the thickness is less than 2 nm, a successive film would be difficult to form, and the periodicity of the square-well potential would be out of order.

The first electron transport layer 36A and the second electron transport layer 36B are set to a predetermined thicknesses within the above-described range, respectively. Accordingly, a satisfactory periodicity of the multiple quantum well can be attained. It is to be noted that the first electron transport layer 36A and the second electron transport layer 36B may be of the same thickness or different thicknesses.

Furthermore, the first electron transport layer 36A may be a thin film which is thinner than the second electron transport layer 36B. Although the first electron transport layer 36A functions as a barrier layer owing to its small electron affinity, the amount of electron current may be further increased by making the barrier layer thinner.

Furthermore, the number of repetitions of the layering of the first electron transport layer 36A and the second electron transport layer 36B are set from 2–10 (preferably 2–4). If the repetition is greater than 10, the organic EL device would be too thick. If the repetition is less than 2, the multiple quantum wells could not be formed.

It is to be noted that the energy gap, ionization potential, and electron affinity for the electron transport layer, the hole transport layer, etc. are obtained according to the below-given measuring conditions and measuring methods.

As for energy gap Eg, the optical absorption spectrum is measured, in which the energy of the long wavelength end of the optical absorption spectrum is the energy gap Eg. More specifically, with the same conditions for forming each layer of the organic EL device, each measure target (e.g. electron transport layer) is individually formed into a thin film with a thickness of approximately 50 nm. A spectrophotometric apparatus capable of measuring optical absorption spectra (Spectrophotometer U-4100: name of product manufactured by Hitachi Ltd.) is used, in which the optical absorption spectrum (wavelength dependency) is measured by irradiating ultraviolet light through visible light to a thick film in the atmosphere.

Figure 6:
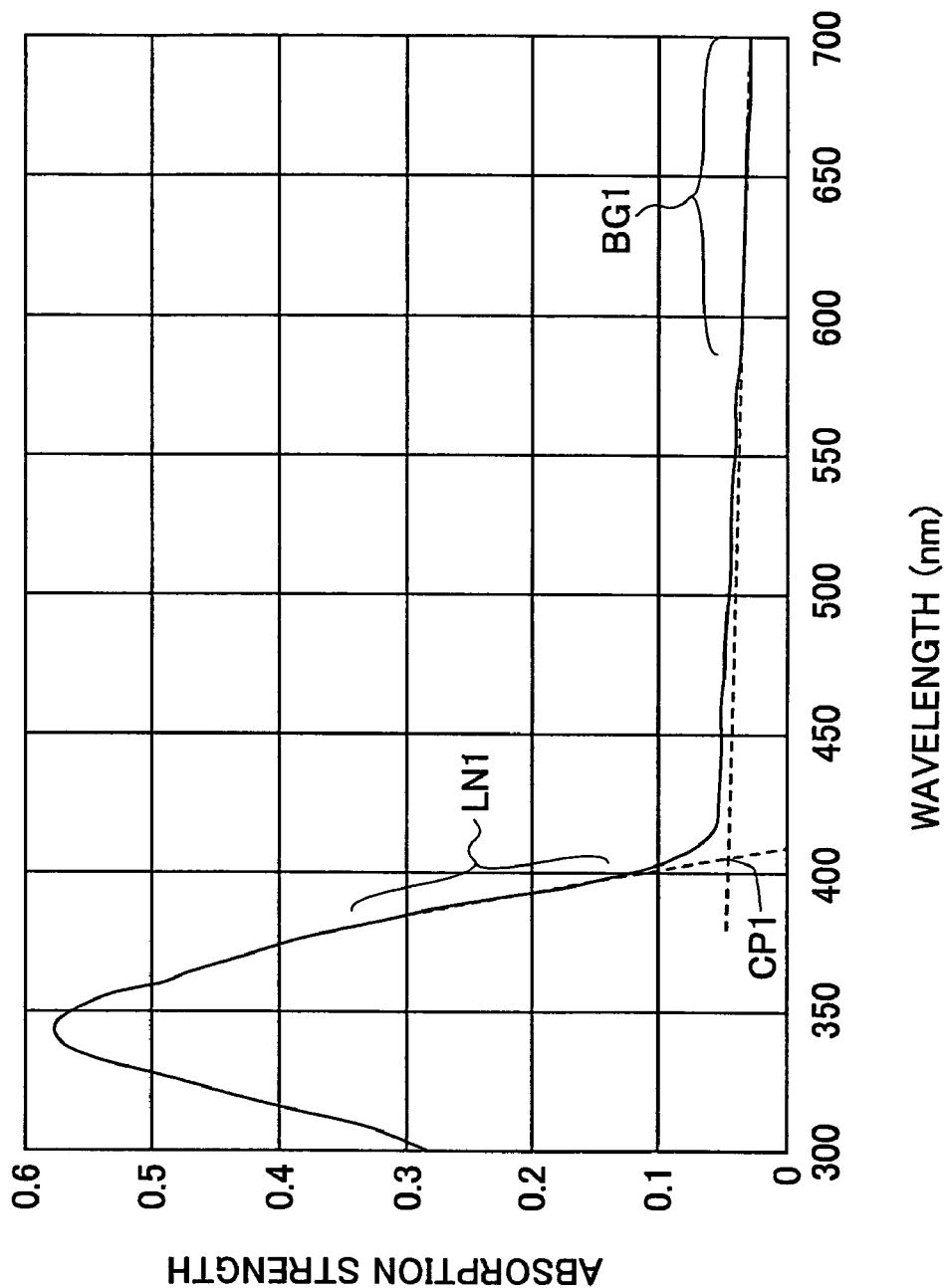
FIG. 6 is a drawing for describing a method for obtaining an energy gap.

FIG. 6 is a drawing showing properties of the optical absorption spectrum. With reference to FIG. 6, the energy gap Eg is obtained by performing energy conversion with respect to a wavelength of an intersection point CP1 between a straight line being extrapolated by approximating a straight line portion LN1 at a skirt of the optical absorption spectrum toward a long wavelength side and a straight line being extrapolated by approximating straight line portion BG1 of the background toward a short wavelength side.

As for the ionization potential Ip, ionization potential Ip is the energy of photoemission threshold measured by an ultraviolet photoelectron analyzing method. More specifically, the number of discharged photoelectrons are measured by irradiating an ultraviolet light to a thin film in the atmosphere by using an atmosphere type ultraviolet photoelectron analyzing apparatus (AC-1: Name of product manufactured by Riken Keiki Co. Ltd.), in which the same thick film used for the energy gap Eg is employed. Thereby, a relation between the energy of the incident ultraviolet ray and the number of photoelectrons is obtained. In terms of measuring conditions, the range of energy of the incident ultraviolet ray is 3.8–6.2 eV, and the strength of the ultraviolet ray is 20 nW.

Figure 7:
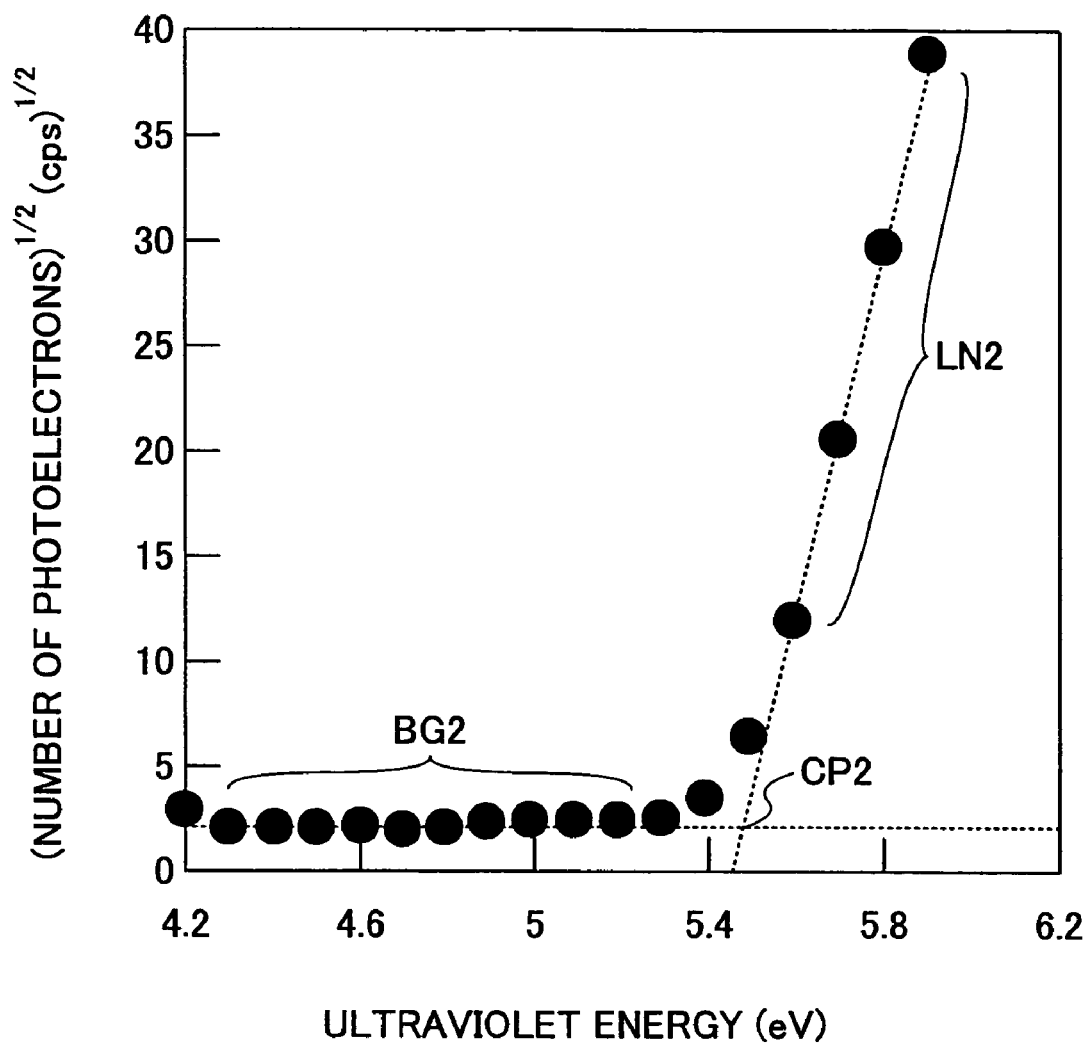
FIG. 7 is a drawing for describing a method for obtaining an ionization potential.

FIG. 7 is a characteristic diagram showing an example of a relation between a square root of the number of photoelectrons and the energy of the incident ultraviolet ray. With reference to FIG. 7, the ionization potential Ip is obtained from the energy of an intersection point CP2 between a straight line being extrapolated by approximating a straight line portion LN2 at a rising part of the characteristic line toward a low energy side and a straight line being extrapolated by approximating a straight line portion of the background toward a high energy side.

Furthermore, the electron affinity Ea is obtained by the difference between the above-obtained ionization potential Ip and the energy gap Eg (Ea=Ip−Eg).

By using these methods, the energy gap, the ionization potential, and the electron affinity of each electron transport material is measured. Thereby, selection of a combination of electron transport layers to be included in the electron transport multilayered body is enabled.

FIG. 8 is a diagram showing measurement values of the energy gap, the ionization potential, the electron affinity of the electron transport layer and the hole transport layer included in the organic EL device with respect to examples which are of the present invention and comparative examples which are not of the present invention. The examples and comparative examples are described below based on the measurement values shown in FIG. 8.

EXAMPLE 1

An anode with a thickness of 150 nm is formed on a glass substrate by a sputtering method with use of ITO, and is subject to UV ozone processing in which the anode surface is irradiated with UV rays under an oxygen atmosphere for 20 minutes. Then, 2-TNATA (thickness 40 nm) serving as the hole injection layer, α-NPD (thickness 10 nm) serving as the hole transport layer, and TYG 201 (thickness 20 nm) serving as the luminescent layer, are formed in order.

Next, starting from TYE 704, the formation of a combination of TYE 704 (thickness 15 nm) and TYG 201 (thickness 15 nm), serving as the electron transport multilayered body, is repeated twice. Furthermore, a single layer of TYE 704 (thickness 20 nm) is formed on the electron transport multilayered body, and the cathode formed of LiF/Al is last formed.

In the organic EL device in this example, a green luminescence is observed in a case where voltage is no less than 3 V. When voltage of 10 V is applied, luminance of 913 cd/m$^2$ and a luminous efficiency of 8.40 cd/A are obtained.

SECOND EXAMPLE

The organic EL element of this example is the same as that of the first example except for repeating the formation of a combination of TYE 704 (thickness 10 nm) and TYG 201 (thickness 10 nm) for three times.

In the organic EL device in this example, a green luminescence is observed in a case where voltage is no less than 3 V. When voltage of 10 V is applied, luminance of 1075 cd/m$^2$ and a luminous efficiency of 9.70 cd/A are obtained.

THIRD EXAMPLE

The organic EL element of this example is the same as that of the first example except for repeating the formation of a combination of TYE 704 (thickness 7.5 nm) and TYG 201 (thickness 7.5 nm) for four times.

In the organic EL device in this example, a green luminescence is observed in a case where voltage is no less than 3 V. When voltage of 10 V is applied, luminance of 1017 cd/m$^2$ and a luminous efficiency of 8.89 cd/A are obtained.

FIRST COMPARATIVE EXAMPLE

The organic EL device in this comparative example is the same as that of the first example except for forming TYG 201 (thickness 50 nm) as the luminescent layer and forming a single layer of TYE 704 (thickness 50 nm) as the electron transport layer instead of the electron transport multilayered body.

In the organic EL device in this comparative example, a green luminescence is observed in a case where voltage is no less than 4 V. When voltage of 10 V is applied, luminance of 967 cd/m$^2$ and a luminous efficiency of 8.25 cd/A are obtained.

SECOND COMPARATIVE EXAMPLE

The organic EL device in this comparative example is the same as that of the first example except for providing a combination of TYE 704 (thickness 30 nm) and TYG 201 (thickness 30 nm) as the electron transport multilayered body.

In the organic EL device in this comparative example, a green luminescence is observed in a case where voltage is no less than 4 V. When voltage of 10 V is applied, luminance of 750 cd/m$^2$ and a luminous efficiency of 7.48 cd/A are obtained.

FIG. 9 shows the layer configurations and evaluation results of the first-third examples and the first-second comparative examples. With reference to FIG. 9, it is apparent that luminous efficiency increases when the layering of the TYE 704 and TYG 201, which form the electron transport multilayered body, is repeated two times or more, when compared to the first comparative example in which the electron transport multilayered body is a single layer of the electron transport layer or the second comparative example in which the number of repetition is 1. Furthermore, the luminous efficiency is highest for the organic EL device of the second example. It is assumed that this owes to the balance between the amount of electron current and the amount of hole current. Furthermore, it is apparent that luminance is also highest for the organic EL device of the second example.

Next, in the TYE 704 and the TYG 201 forming the electron transport multilayered body, examples and comparative examples replacing the TYG 201 with Alq 3 is described.

FOURTH EXAMPLE

The organic EL element of this example is the same as that of the second example except for using Alq 3 (thickness 10 nm) as an alternative of TYG 201 (thickness 10 nm), in which the number of the repetitions is 3.

In the organic EL device in this example, a green luminescence is observed in a case where voltage is no less than 5 V. When voltage of 10 V is applied, luminance of 994 cd/m$^2$ and a luminous efficiency of 7.52 cd/A are obtained.

FIFTH EXAMPLE

The organic EL element of this example is the same as that of the fourth example except for forming each layer of the electron transport multilayered body with a thickness of 7.5 nm, and repeating for 4 times.

In the organic EL device in this example, a green luminescence is observed in a case where voltage is no less than 5 V. When voltage of 10 V is applied, luminance of 1021 cd/m$^2$ and a luminous efficiency of 7.44 cd/A are obtained.

THIRD COMPARATIVE EXAMPLE

The organic EL element of this comparative example is the same as that of the fourth example except for employing an electron transport layer having a single layer of Alq 3 (thickness 30 nm) as an alternative of the electron transport multilayered body and employing TYE 704 (thickness 50 nm) as the electron transport layer in abutment with the cathode.

In the organic EL device in this example, a green luminescence is observed in a case where voltage is no less than 5 V. When voltage of 10 V is applied, luminance of 1058 cd/m$^2$ and a luminous efficiency of 6.68 cd/A are obtained.

FOURTH COMPARATIVE EXAMPLE

The organic EL element of this comparative example is the same as that of the fourth example except for forming each layer of the electron transport multilayered body with a thickness of 30 nm and repeating 1 time.

In the organic EL device in this example, a green luminescence is observed in a case where voltage is no less than 5 V. When voltage of 10 V is applied, luminance of 1005 cd/m$^2$ and a luminous efficiency of 6.75 cd/A are obtained.

FIG. 10 shows the layer configurations and evaluation results of the fourth-fifth examples and the third-fourth comparative examples. With reference to FIG. 10, it is apparent that luminous efficiency increases when the layering of the TYE 704 and Alq 3, which form the electron transport multilayered body, is repeated three times or more, when compared to the third comparative example in which the electron transport multilayered body is a single layer of the electron transport layer or the fourth comparative example in which the number of repetition is 1.

Furthermore, in comparing the second-third examples with the fourth-fifth examples having the same number of repetitions, the organic EL device of the second-third examples having multilayers of the TYG 201 layer and the TYE 704 layer have a higher improvement rate of luminous efficiency than the organic EL device of the fourth-fifth examples having multilayers of the Alq3 layer and the TYE 704 layer with respect to the comparative example where its repetition number is 1 (second comparative example, fourth comparative example). The reason for this is assumed in that the difference of electron affinity between the Alq 3 layer and the TYE 704 layer is 0.10 eV whereas the difference of electron affinity between the TYG 201 layer and the TYE 704 layer is 0.23 eV, and that the combination between the TYG 201 and the TYE 704 can form multiple quantum wells more sufficiently, thereby a more significant multiple quantum well effect is generated.

SECOND EMBODIMENT

Figure 11:
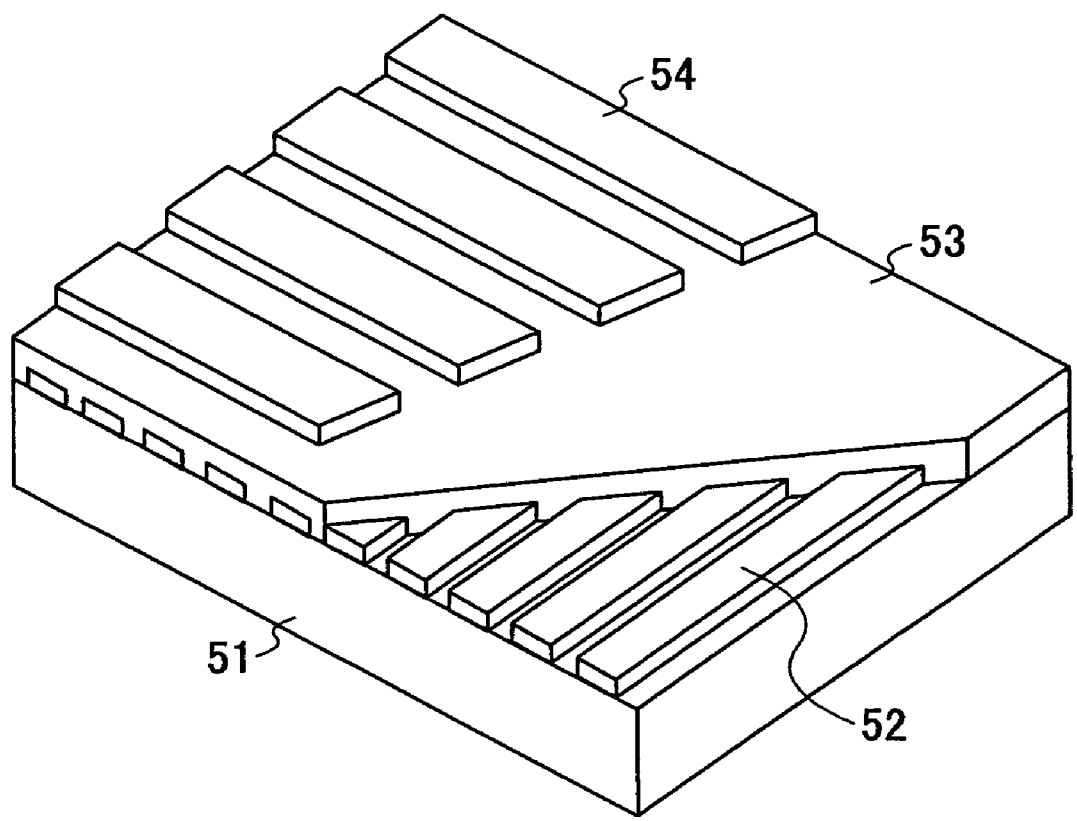
FIG. 11 is an exploded perspective view showing an organic EL display according to a second embodiment of the present invention.

FIG. 11 is an exploded perspective view showing an organic EL display according to a second embodiment of the present invention. With reference to FIG. 11, an organic EL display 50 includes, for example, a glass substrate 51, a anode 52 formed on the glass substrate in a stripe-like manner, an cathode 54 formed perpendicularly facing the anode 52 in a stripe-like manner, and a multilayered body 53 formed between the anode 52 and the cathode 54. Furthermore, although not illustrated, the organic EL display 50 includes, for example, a drive circuit for driving voltage applied between the cathode and the anode, and a sealing material for preventing exposure to water vapor or oxygen.

The organic EL display 50 is able to illuminate a desired area by applying voltage to the anode 52 and the cathode 54 in a desired area. The characteristic of the organic EL display 50 is that the anode 52, the multilayered body 53, and the cathode 54 are formed of the above-described organic EL device of the present invention. Therefore, an organic EL display which is able to attain excellent luminous efficiency and a long life-span can be obtained.

For example, in the embodiments of the present invention, the organic EL device may be formed by layering on a substrate from an anode side or from a cathode side.

INDUSTRIAL APPLICABILITY

With the present invention, by providing an electron transport multilayered body having alternately layered electron transport layers having different electron transportabilities on a cathode side of a luminescent layer in an organic electroluminescence device, an organic electroluminescence device capable of attaining excellent luminous efficiency and a long life-span can be provided.

Further, the present invention is not limited to these embodiments, but variations and modifications may be made without departing from the scope of the present invention.

What is claimed is:

1. An organic electroluminescence device comprising:
   an anode;
   a luminescent layer formed on the anode;
   a carrier transport multilayered body formed on the luminescent layer; and
   a cathode formed on the carrier transport multilayered body;
   wherein the carrier transport multilayered body is alternately layered by a first carrier transport layer and a second carrier transport layer,
   wherein the first carrier transport layer and the second carrier transport layer have electron transportabilities that are different from each other, and
   wherein the carrier transport multilayered body includes alternate layers of the first carrier transport layer and the second carrier transport layer that are repeated in a range from 2–10 times.

2. The organic electroluminescence device as claimed in claim 1, wherein the first carrier transport layer and the second carrier transport layer have electron affinities that are different from each other.

3. The organic electroluminescence device as claimed in claim 1, wherein the first carrier transport layer and the second carrier transport layer have predetermined film thicknesses.

4. The organic electroluminescence device as claimed in claim 1, wherein the first carrier transport layer has an electron affinity which is smaller than that of the second carrier transport layer, and has a thickness which is same as or smaller than that of the second carrier transport layer.

5. The organic electroluminescence device as claimed in claim 1, wherein one of the first carrier transport layer and the second carrier transport layer is of a material which is the same as that of the luminescent layer.

6. The organic electroluminescence device as claimed in claim 1, further comprising:
   an electron transport layer between the carrier transport multilayered body and the cathode;
   wherein the electron transport layer has an energy gap that is same as or larger than a larger one of the first carrier transport layer and the second carrier transport layer.

7. The organic electroluminescence device as claimed in claim 1, wherein the carrier transport multilayered body further includes a third carrier transport layer, and includes repeated layers of the first carrier transport layer, the second carrier transport layer, and the third carrier transport layer in that order.

8. The organic electroluminescence device as claimed in claim 1, further comprising:
   a hole transport layer between the anode and the luminescent layer;
   wherein the hole transport layer has an electron affinity which is smaller than that of the luminescent layer.

9. The organic electroluminescence device as claimed in claim 8, further comprising:
   another hole transport layer between the anode and the luminescent layer;
   wherein the hole transport layer and the other hole transport layer are alternately layered,
   wherein the hole transport layer and the other hole transport layer have ionization potentials that are different from each other.

10. An organic electroluminescence display comprising:
    the organic electroluminescence device in claim 1.

* * * * *